United States Patent
German et al.

(10) Patent No.: US 10,074,385 B2
(45) Date of Patent: *Sep. 11, 2018

(54) DISC DRIVE CIRCUITRY SWAP

(71) Applicant: Seagate Technology LLC, Cupertino, CA (US)

(72) Inventors: Robert J. German, Jordan, MN (US); David A. Hartman, Apple Valley, MN (US); Michael T. Brady, Loveland, CO (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/589,702

(22) Filed: May 8, 2017

(65) Prior Publication Data

US 2017/0243603 A1    Aug. 24, 2017

Related U.S. Application Data

(62) Division of application No. 11/453,167, filed on Jun. 14, 2006, now Pat. No. 9,679,602.

(51) Int. Cl.
*H04N 5/765* (2006.01)
*G11B 5/09* (2006.01)
(Continued)

(52) U.S. Cl.
CPC .......... *G11B 5/09* (2013.01); *G11B 20/10018* (2013.01); *G11B 20/10037* (2013.01);
(Continued)

(58) Field of Classification Search
CPC .......................... G11B 5/09; G11B 20/10018
See application file for complete search history.

(56) References Cited

U.S. PATENT DOCUMENTS 5,398,157 A    3/1995 Paul
7,009,797 B2    3/2006 Zayas et al.
(Continued)

FOREIGN PATENT DOCUMENTS

WO    9534066 A1    12/1995

OTHER PUBLICATIONS

"My Dead Hard Drive story or How I restored my save games", 2013.
(Continued)

*Primary Examiner* — Hung Dang
*Assistant Examiner* — Girumsew Wendmagegn
(74) *Attorney, Agent, or Firm* — Holzer Patel Drennan

(57) ABSTRACT

A method comprises creating calibration data using a first control circuitry of an apparatus, replacing the first control circuitry with a second control circuitry in the apparatus, and operating the apparatus with the second control circuitry using the calibration data. As an example, the apparatus may be a disc drive. The second control circuitry may be substantially similar to the first control circuitry such that calibration measurements using the first control circuitry are applicable to the second control circuitry. The first control circuitry may be included in a circuit board that is replaced with a second circuit board including the second control circuitry. In an exemplary embodiment, the second circuit board may include different and/or additional components relative to the first circuit board, such as integrated video inputs and/or video control circuitry.

20 Claims, 5 Drawing Sheets

(51) Int. Cl.
*G11B 20/18* (2006.01)
*G11B 20/10* (2006.01)
*H05K 7/02* (2006.01)

(52) U.S. Cl.
CPC ...... *G11B 20/1816* (2013.01); *G11B 20/1883* (2013.01); *G11B 20/1889* (2013.01); *H05K 7/02* (2013.01); *G11B 2020/183* (2013.01); *G11B 2020/1896* (2013.01); *G11B 2220/20* (2013.01); *G11B 2220/21* (2013.01)

(56) References Cited

U.S. PATENT DOCUMENTS

| | | | |
|---|---|---|---|
| 9,679,602 B2 * | 6/2017 | German | G11B 5/09 |
| 2003/0161116 A1 | 8/2003 | Bovell | |
| 2004/0161226 A1 * | 8/2004 | Watson | G11B 27/034 386/235 |
| 2004/0268039 A1 | 12/2004 | Ballard et al. | |
| 2005/0086702 A1 | 4/2005 | Cormack et al. | |
| 2005/0254375 A1 | 11/2005 | Shen-Hsien | |
| 2007/0132790 A1 | 6/2007 | Miller | |
| 2007/0165660 A1 | 7/2007 | Fang et al. | |
| 2007/0223870 A1 * | 9/2007 | Farling | H04N 5/76 386/278 |

OTHER PUBLICATIONS

Neville Ridley-Smith, "Dead Hard Drive Story or How I restored my save game", http://www.deadharddrive.com, 2003, p. 1-10.

* cited by examiner

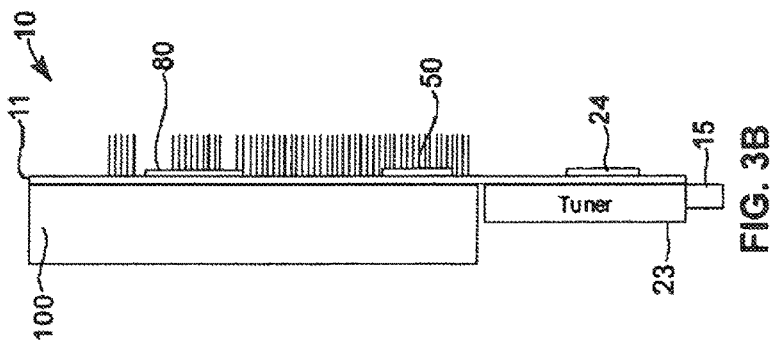
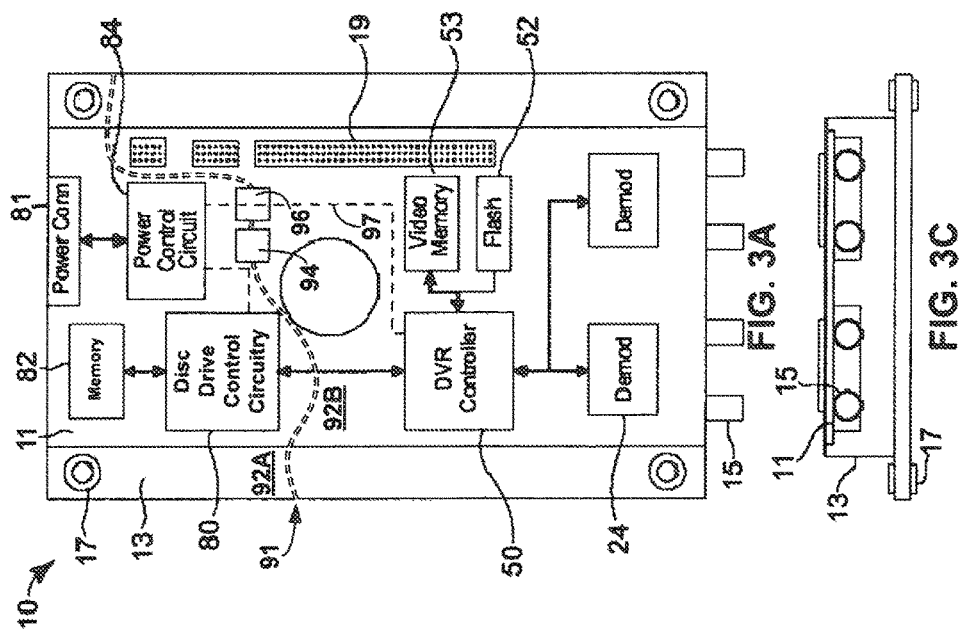
FIG. 3B
FIG. 3A
FIG. 3C

DISC DRIVE CIRCUITRY SWAP

PRIORITY CLAIM

This application is a divisional application of U.S. application Ser. No. 11/453,167 filed Jun. 14, 2006, now issued as U.S. Pat. No. 9,679,602, the entire disclosures of which are incorporated herein by reference for all purposes.

TECHNICAL FIELD

This application relates to disc drives.

BACKGROUND

Disc drives are commonly used for data storage in computers such as desktop computers, notebook computers, servers and the like. Disc drives are also used in other applications, such as in consumer devices. Consumer devices that utilize disc drive storage include digital video recorders (DVRs), video game consoles and others. Small form disc drives are used in portable devices such as portable music players, portable video players, personal digital assistants (PDAs) and the like. Other suggested applications for small form-factor disc drives include cell phones and portable data storage modules.

Even though disc drives are now used to store data in a variety of devices, disc drives are generally designed to meet the requirements of computers. However, the requirements of the end use device may differ than the requirements of a computer. For example, a disc drive adapted for a computer is configured to provide a low error rate, e.g., the disc drive will reread a portion of the media surface multiple times in attempt to recover unreadable data. However, recovering every bit of data is not necessary for audio or visual playback devices such DVRs and portable music players. In fact, the time it takes a disc drive to reread a portion of data storage media may cause a pause in the playback, creating an objectionable event for a user. In contrast, a small error in the data would likely be insignificant or even undetectable to a user. As this example illustrates, configuring disc drives according to a specific application may be useful to increase the performance of devices using disc drives.

SUMMARY

In general, the invention provides techniques for economically adapting disc drives for a variety of applications. In particular, embodiments are directed to techniques for swapping control circuitry in manufactured disc drives according to the end use of the disc drives. A multitude of disc drives having the same design are manufactured, tested and calibrated. Some of the drives, e.g., drives that are to be used in computers, may then be ready to be sold. However, some of the drives may need different or additional integrated features than included with the standard design. The standard control circuitry in these drives is swapped for different control circuitries that provide the different or additional integrated features. The testing and calibration of the drives prior to swapping control circuitry provides calibration information that is sufficient to operation the disc drives with the different control circuitries. For example, the different control circuitries may have different communication interfaces, different sizes that change the form factor of the disc drives, and/or different integrated features than the standard control circuitry.

The first control circuitry may be circuitry designed for use in a computer, while the second control circuitry provides an application-specific configuration for the disc drive. In this manner, a disc drive configured for an end use may be tested in parallel using preexisting systems for testing currently available disc drives. As another example, the first control circuitry may be specifically designed for calibration of the disc drive. For example, the first control circuitry may include a more powerful processor than the second control circuitry to speed up the process of calibration.

In an embodiment, a method comprises creating calibration data using a first control circuitry of an apparatus, replacing the first control circuitry with a second control circuitry in the apparatus, and operating the apparatus with the second control circuitry using the calibration data.

In a different embodiment, a circuit board for a disc drive assembly comprises a first ground plane and a second ground plane. The circuit board also includes a low pass filter. The first ground plane is electrically coupled to the second ground plane by the low pass filter. The circuit board further includes a disc drive controller that reads and writes data to a media disc of the disc drive assembly and a digital video recorder controller that controls storage, retrieval and display of selected video content. The disc drive controller is electrically coupled to the first ground plane, and the digital video recorder controller is electrically coupled to the second ground plane.

Embodiments of the invention may provide one or more of the following advantages. For example, embodiments allow for common manufacturing and testing facilities to be used in the manufacture of a plurality of disc drive configurations. For example, disc drives may be manufactured, tested and calibrated using a common design with a common control circuitry. Following testing and calibration, the common control circuitry can be swapped with any one of a number of different application-specific circuitries.

Embodiments may reduce the capitol investment required to produce disc-drives having non-standard interfaces and/or form factors. Disc drive manufacturers gain the flexibility to produce disc drives having different configurations according to market need.

Furthermore, disc drive manufactures may provide additional features, such as additional interfaces and/or processing capability, on a common circuit board with disc drive circuitry. Such features may be selected according to a customer's request because a disc drive manufacturer is not constrained by the high volume production necessary to economically support building new testing equipment for non-standard form factors and/or interfaces.

In devices that generally include a standalone disc drive and separate control circuitry, replacing multiple circuit boards with a single circuit board allows redundant components, e.g., processors, power supplies, and/or voltage regulators, to be eliminated. This may reduce the overall production cost of the device.

The details of one or more embodiments of the invention are set forth in the accompanying drawings and the description below. Other features, objects and advantages of the invention will be apparent from the description and drawings, and from the claims.

BRIEF DESCRIPTION OF THE DRAWINGS

FIGS. 3A-3C are top, side, and bottom side views, respectively, illustrating an example embodiment of a disc drive assembly adapted to record and play video content.

DETAILED DESCRIPTION

Figure 1A:
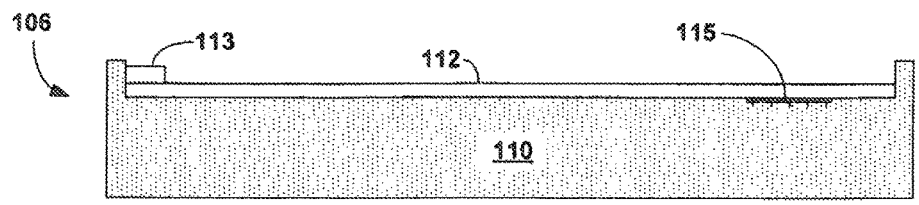
FIGS. 1A-1D illustrate exemplary steps of a control circuitry swap for a disc drive assembly.

FIGS. 1A-1D illustrate exemplary steps of a control circuitry swap for a disc drive assembly. FIG. 1A illustrates disc drive assembly 106. Disc drive assembly 106 includes disc drive housing 110, which encases a recordable media disc and a head to read and/or write data to the recordable media disc. For example, the recordable media disc may be a magnetic, optical or magneto-optic disc. In some embodiments, housing 110 may encase multiple recordable media discs in a stacked configuration. Some embodiments also include two heads for each media disc—one to read and/or write data for each side of a media disc.

Disc drive assembly 106 also includes printed circuit board (PCB) 112. PCB 112 includes control circuitry to operate read and/or write operations from the head(s) to the media disc(s) within housing 110. PCB 112 controls disc drive functions within housing 110 via feed-through connectors 115.

As shown in FIG. 1A, PCB 112 also includes disc drive interface 113. For example, disc drive interface 113 may be a standard disc drive interface commonly used to connect a disc drive within a computer. As examples, disc drive interface 113 may be an Integrated Drive Electronics (IDE) interface, an Advance Technology Attachment (ATA) interface, a Fibre Channel interface (FC), Small Computer System Interface (SCSI) or a Serial Attached SCSI interface (SAS). In other embodiments, PCB 112 may include multiple interfaces.

Disc drive assembly 106 is in a substantially ready-to-be-shipped form. For example, disc drive assembly 106 has been tested and calibrated, including calibration of the signal responses produced by heads within housing 110. As part of the testing, media discs within housing 110 may also have been media mapped, e.g., the recordable surfaces of the media disc may be tested to map unusable portions. Calibration data has been recorded and stored within housing 110. As an example, calibration data may have been recorded to a media disc within housing 110. In different embodiments, disc drive assembly 106 may or may not have been formatted. Disc drives to be installed in computers are often formatted by the manufacturer. Formatting generally includes creating sectors, writing configuration tables and setting recovery levels.

Figure 1B:
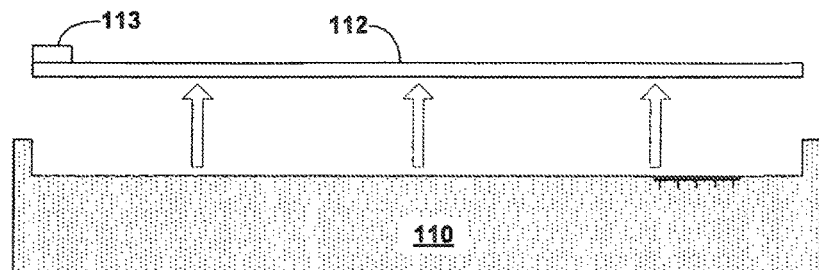

As shown in FIG. 1B, PCB 112 is removed from housing 110. For example, PCB 112 may be removed from housing 110 using automated manufacturing equipment. In some embodiments, this may require removing screws that attach PCB 112 to housing 110.

Figure 1C:
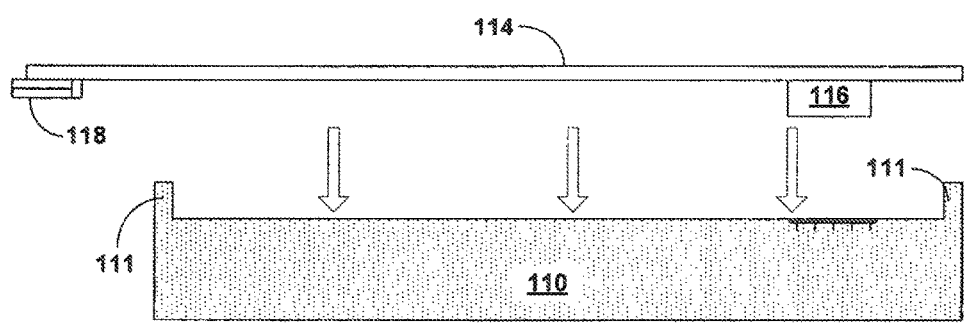

In FIG. 1C, PCB 114 is attached to housing 110. For example, pick-and-place techniques may be used to attach PCB 114 to housing 110. In some embodiments, attaching PCB 114 to housing 110 may require screwing PCB 114 to housing 110.

Figure 1D:
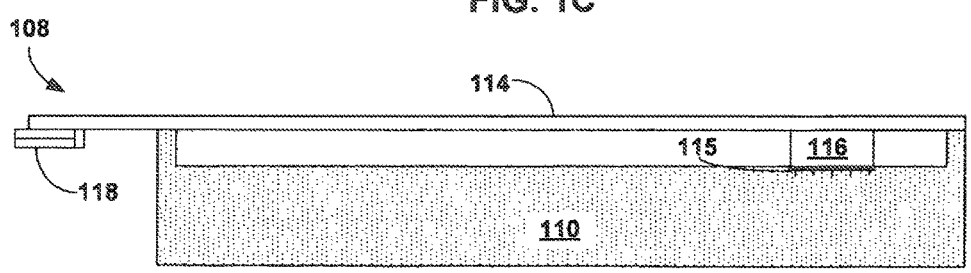

Once PCB 114 is attached to housing 110, PCB 114 and housing 110 combine to form disc drive assembly 108, as shown in FIG. 1D. Disc drive assembly 108 provides additional or different functionality compared to disc drive assembly 106. For example, disc drive control circuitry of PCB 114 may operate in a different manner than disc drive control circuitry of PCB 112. For example, control circuitry of PCB 114 may skip over unreadable portions of data rather than spend time rereading those portions, which may be useful for audio or visual playback devices. Additional functionality provided by PCB 114 may include functionality commonly implemented on a separate PCB in a device including a stand-alone disc drive. For example, disc drive assembly 106 may be considered a stand-alone disc drive. As an example, if disc drive assembly 108 is to be included within a DVR, PCB 114 may include additional features of the DVR. In some embodiments, a device including disc drive assembly 108 may include no additional or very limited circuitry beyond that incorporated within PCB 114. Combining the functionality of disc drive control circuitry with other circuitry of a device onto a single PCB, e.g., PCB 114 may reduce the cost and size of the device compared to similar devices having separate PCBs.

Because PCB 114 includes additional functionality, and, therefore additional components, compared to PCB 112, PCB 114 is typically larger than PCB 112. For this reason, PCB 114 will not fit within the external recess of housing 110 created by walls 111. PCB 114 includes spacer 116 with electrical contacts to connect PCB 114 to feed-through connectors 115.

PCB 114 includes interface 118. Interface 118 is different than interface 113. For example, interface 113 may be adapted for the device in which disc drive assembly 108 will be used. For example, if disc drive assembly 108 is to be included within a DVR, interface 113 may be a video input or output connection. As examples, disc drive interface 113 may be a Digital Visual Interface (DVI), a High-Definition Multi-media Interface (HDMI), a component video interface, a coaxial cable jack, a composite video interface, an s-video interface or a left-right audio interface. In other embodiments, PCB 114 may include multiple interfaces, including the same interface as interface 113.

Because interface 118 is different than interface 113, it is difficult to test and calibrate disc drive assembly 108 using the equipment used to test disc drive assembly 106. It is also difficult to test and calibrate disc drive assembly 108 and disc drive assembly 106 using the same equipment because disc drive assembly 108 has a different form factor than disc drive assembly 106. Simply, disc drive assembly 108 may not fit within a slot used to hold disc drives during testing and calibration. However, because calibration data was recorded within housing 110 from the testing and calibration of disc drive assembly 106, that calibration data can be used to operate disc drive assembly 108.

To ensure that the calibration data is sufficiently accurate, the design of control circuitry within PCB 114 is very similar to that of control circuitry within PCB 112. For example, the analog signal paths from heads within housing 110 may be substantially identical in PCB 112 and PCB 114. Furthermore, additional components within PCB 114 may be shielded to limit interference between the analog signal paths. As another example, power and/or ground planes within PCB 114 may be partitioned. The partitions may be electrically coupled using low-pass filters to limit high-frequency interferences created by the additional components on PCB 114 compared to PCB 112.

Figure 2A:
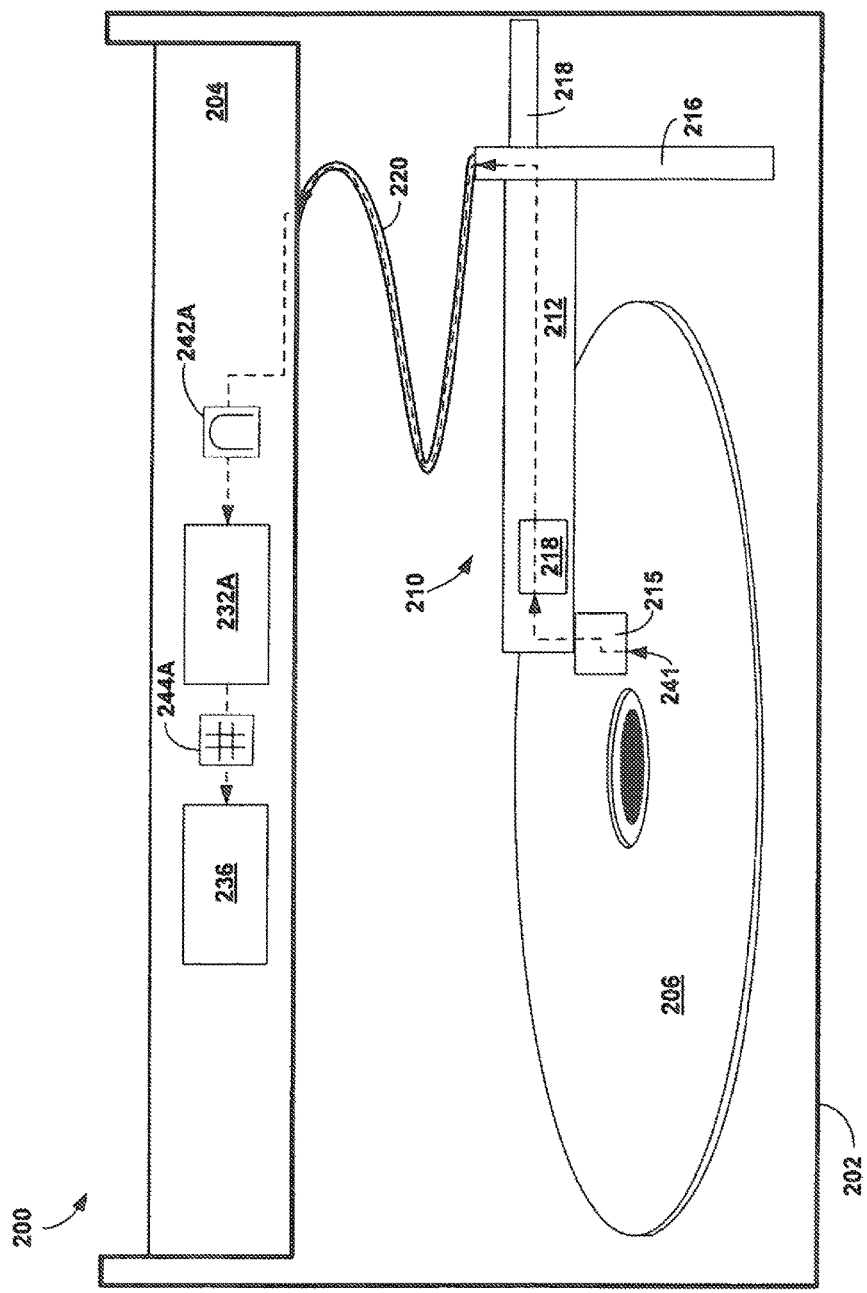
FIGS. 2A and 2B illustrate a disc drive assembly including an analog signal path before and after switching control circuitry for the disc drive assembly.
Figure 2B:
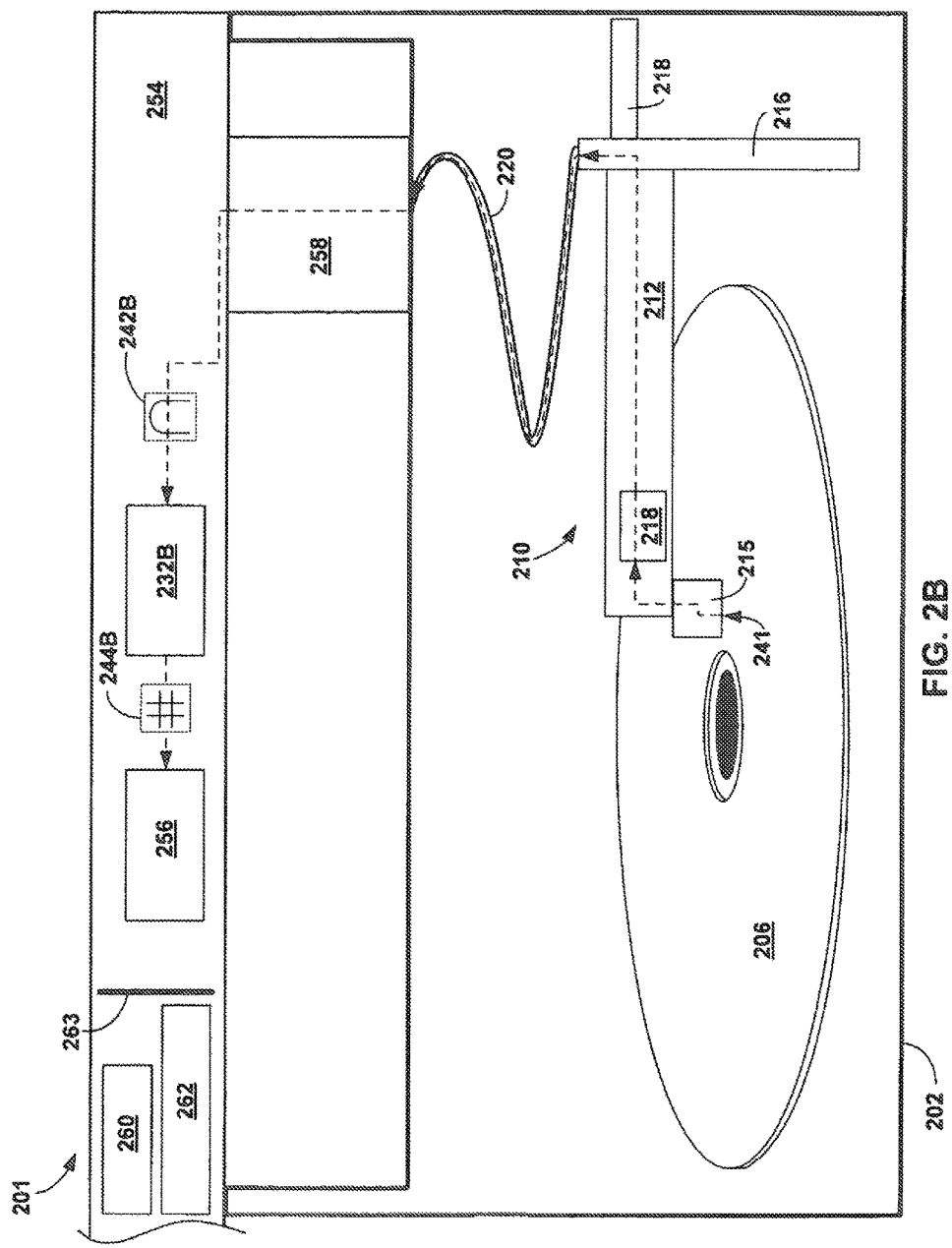

FIGS. 2A and 2B illustrate disc drive assemblies 200 and 201 respectively. Disc drive assemblies 200 and 201 share a common housing, housing 202. Disc drive assembly 201 differs from disc drive assembly 200 in that disc drive assembly 200 includes PCB 204, while disc drive assembly 201 includes PCB 254. For example, disc drive assembly 200 may be the same as disc drive assembly 106 in FIG. 1A; disc drive assembly 201 may be the same as disc drive assembly 108 in FIG. 1D. The techniques described with respect to FIGS. 1A-1D may be used to create disc drive assembly 201 by swapping PCB 204 in disc drive assembly 200 with PCB 254.

As shown in both FIG. 2A and FIG. 2B, housing 202 encases rotatable media disc 206. For example, media disc 206 may be a magnetic, optic, magneto-optic or other type of media disc. Actuator assembly 210 is also encased within housing 202. Actuator assembly 210 includes head 215, actuator arm 212, actuator bearing 216 and voice coil 218. Voice coil 218 actuates actuator arm 212 to position head 215 adjacent to different portions of media disc 206. Different embodiments may include actuation mechanisms different than actuator assembly 210.

Signals from head 215 traverse analog signal path 241 within housing 202. Analogue signal path 241 includes head 215, preamp 218, actuator arm 212 and flex tape 220. In disc drive assembly 200, flex tape 220 connects to PCB 204. Within PCB 204, analog signal path 241 continues as analog signal path 242A. Analogue signal path 242B travels through PCB 204 to channel 232A, where analog signals from head 215 are converted to digital data signals. The digital data signals travel along digital signal path 244A to disc drive controller 236. Disc drive controller 236 controls the functions of disc drive assembly 200 including read and write operations and communications with a device in which disc drive assembly 200 is installed. Disc drive controller 236 may include a processing chip, firmware, software, memory, interfaces and/or additional components.

In comparison, in disc drive assembly 201, flex tape 220 connects to PCB 254 via spacer 258. Within PCB 254, analog signal path 241 continues as analog signal path 242B to channel 232B, where analog signals from head 215 are converted to digital data signals. The digital data signals travel along digital signal path 244B to controller 256. Controller 256 controls the functions of disc drive assembly 200 including read and write operations. Controller 256 also controls the functions of components 260 and 262, which give PCB 254 additional functionality compared with PCB 204. Controller 256 may include a processing chip, firmware, software, memory, interfaces and/or additional components.

For example, if disc drive assembly 201 is part of a DVR, components 260 and 262 may be video signal inputs/outputs, tuners or other video signal processing components. In FIG. 2B, components 260 and 262 are shown to demonstrate that PCB 254 includes more components than PCB 204. The actual function of the additional components on PCB 254 relative to PCB 204 will differ according to the end use of disc drive assembly 201.

Calibration of disc drive assembly 200 includes measuring analog signals at channel 232A. The analog signals traverse analog signal path 241 and analog signal path 242A between head 215 and channel 232A before being measured. Because analog signals are only measured at channel 232A, the effects of head 215, preamp 218, actuator arm 212, voice coil 218, flex tape 220, PCB 204, channel 232A and other components of disc drive assembly 200 on an analog signal are incorporated into each calibration measurement. No measurements of the separate effect of any of these components are taken during calibration of disc drive assembly 200.

Overall, the design of PCB 254 includes many features that allow calibration data created using assembly 200 to be applicable to the operation of assembly 201. As one example, analog signal path 242B is substantially similar to analog signal path 242A. For example, analog signal path 242B may be as close to the same as analog signal path 242A as possible. Even the radii of turns in analog signal path 242B may be the same as the radii in corresponding turns of analog signal path 242A.

One difference between analog signal path 242A and analog signal path 242B is that analog signal path 242B includes spacer 258. Spacer 258 includes low-resistance electrical interconnects. These electrical interconnects may be shielded to limit the effect of spacer 258 on analog signals traversing analog signal path 242B.

As another example of how PCB 254 is similar to PCB 204, channel 232A is substantially similar to channel 232B. For example, channel 232A may be the same part and made by the same manufacturer as channel 232B. The part and manufacturer used for channels 232A and 232B may be selected to have a minimal variance.

PCB 254 also includes shielding 263 to limit interference from components 260 and 262 from acting on signals traversing analog signal paths 241 and 242B. Shielding 263 is merely exemplary, the location and extent of shielding 263 varies in different embodiments of the invention. Embodiments of the invention may require shielding in multiple locations and surrounding multiple components of PCB 254 to isolate noise and prevent interference with signals traversing analog signal paths 241 and 242B.

Through careful design of PCB 254, calibration data gathered using disc drive assembly 200 may be applicable to disc drive assembly 201. During testing of an exemplary embodiment using techniques described herein, there was a slight increase in bit error rate with respect to assembly 201 compared to assembly 200. Testing showed almost no difference in the tracking of head 215 on media disk 206 with assembly 201 as compared to assembly 200.

FIGS. 3A-3C are top, front, and side views, respectively, that illustrate an example embodiment of the single board digital video system (hereinafter referred to as "video system 10"). Video system 10 includes PCB 11, which may be used as replacement control circuitry for a calibrated disc drive assembly as previously described with respect to FIGS. 1A-1D, 2A and 2B.

FIGS. 3A-3C illustrate an example physical layout of component parts of video system 10 of the present invention on a single PCB 11 as well as physical data storage 100. For example, physical data storage 100 may include a media disc, head and actuator assembly. Physical data storage 100 is mounted to PCB 11 via a mounting bracket 13 and several screws 17. External connectors 15 are external connection to tuners 23. Rubber grommets (not shown) between the mounting screws and mounting brackets provide shock and vibration absorption for video system 10.

Video system 10 includes a disc drive control circuitry 80 and associated disc drive memory 82, and power control circuit 84. A power connector 81 allows for connection to an external power source. A DVR controller 50 provides DVR control functionality and has an associated video memory 53 and flash memory 52. Tuners 23 provide for tuning of the incoming video signal and demodulators 24 separate the lower frequency digital content from the higher frequency carrier. Audio/video connectors 19 allow for input/output of various audio/video signals, such as composite video, s-video, component video, left/right audio or other audio/video signals. Physical data storage 100 is mounted on the underside of PCB 11.

Although a particular PCB layout for video system 10 is shown and described with respect to FIGS. 3A-3C, it shall be understood that other PCB layouts could also be used without departing from the scope of the present invention. The various PCB components could be arranged on PCB 11 in a variety of ways, and different components could be mounted either on the top or the bottom of PCB 11 depending upon the particular layout chosen by the designer. However, the layout of PCB 11 is selected to allow calibration data from a disc drive assembly that included physical data storage 100 and a different PCB other than PCB 11 to be used in the operation of video system 10.

As shown in FIGS. 3A-3C, video system 10 is fabricated such that the electronic components of video system 10 are integrated onto a single PCB 11. The physical connection for the interface over which DVR controller 50 and disc drive control circuitry 80 communicate is, therefore, composed of a PCB trace. Fabrication of video system 10 using a single PCB for all of the electronic components provides several advantages over conventional DVRs in which separately fabricated and individual PCBs, each containing some fraction of the DVR components, are connected using various external connectors such as PATA or SATA ribbon cables and the like.

For example, all of the components for the video system 10 are incorporated into a single PCB, reducing the number and complexity of components needed to implement the video system and, as a result, the total cost of the video system. Reducing the number of components also improves the overall reliability of the video system. Further, the compact architecture results in a smaller overall size and thickness of the resulting video system. Integrating the DVR module and the disc drive module into a single PCB also reduces the need for communication between different PCBs and delays associated with such inter-board communication. To phrase another way, video system 10 provides for communication of information between the DVR module and the storage control module without forwarding the information between multiple PCBs.

As another example, placement of the electronics associated with both the DVR controller 50 and the disc drive control circuitry 80 on a single PCB 11 allows video system 10 to take advantage of ground plane layer(s) located within the PCB. The purpose of these ground plane layer(s) is to reduce grounding resistance and inductance as well as to provide a shield against EMI and RFI. Using a ground plane to connect all ground points on PCB 11 helps to ensure that all circuit ground points are at the same potential. A ground plane also reduces the effect of radiated EMI on the performance of a circuit by reducing the electrical field strength in the vicinity of the ground plane. In this way, electrical noise, together with EMI and electrostatic discharge (ESD) performance, can be significantly improved by the use of a ground plane. This may significantly reduce or even eliminate the necessity of additional external shielding. In addition, the physical layout of the PCB on which video system 10 is manufactured may be designed such that the PCB traces are as short as possible, which further aids in minimizing EMI radiation.

To reduce the effects of DVR controller 50, video memory 53, flash memory 52, tuners 23, demodulators 24 and audio/video connectors 19 on the analog signal path from on analog signals from one or more heads within physical data storage 100, one or more of the ground plane layers of PCB 11 are partitioned. For example, ground plane partitions 92A and 92B are shown in FIG. 3A. Partitions 92A is separated from partition 92B by gap 91. Partitions 92A and 92B occupy a common layer within PCB 11. Partition 92A provides grounding to components of PCB 11 that are also included in a conventional disc drive assembly, including disc drive control circuitry 80. Partition 92B provides grounding to the other components of PCB 11, including DVR controller 50, tuner 23 and demodulators 24. Partitions 92A is electrically coupled to partition 92B by low-pass filter 94. Low-pass filter 94 filters out high-frequency noise while providing a common ground potential for each of ground plane partitions 92A and 92B. Similarly, power supply trace 97, which supplies power to DVR controller 50 from power control circuit 84, includes low-pass filter 96 to filter out high-frequency noise. Low-pass filters 94 and 96 help ensure that calibration data for physical data storage 100 created using a PCB other than PCB 11 is sufficiently accurate to allow operation of video system 10 without further calibration.

Integration of video system 10 on a single PCB also allows the various components to share power supplies, memory buffers and other hardware components and eliminates unnecessary interconnects. For example, the various voltages supplied by voltage regulator 86 on storage control module 40 may be shared among the various system components. Power control circuit 84 generates, monitors and controls the power supplied to all of the components of video system 10, including DVR controller 50, disc drive control circuitry 80, tuners 23 and physical data storage 100. Thus, fabrication of video system 10 on a single PCB reduces redundant repetition of certain PCB components leading to an associated reduction in size, cost and complexity of the resulting video system 10.

As a result, video system 10 is a complete, tested hardware and software solution that integrates the features of a disc drive with DVR control and video content reception functionality. By having the necessary hardware and software interfaces, it allows quick design and manufacture of customized DVR solutions that meet local geographic and market requirements. This may be of great advantage to DVR manufacturers, who would no longer need to go through the lengthy and costly design process required to combine the individual components into a workable DVR system.

Figure 4:
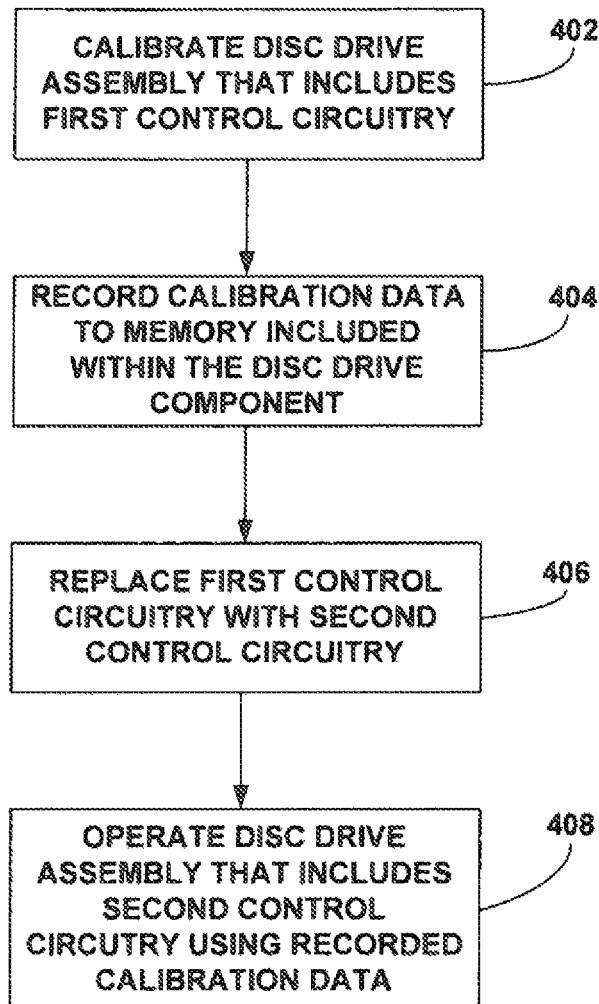
FIG. 4 is a block diagram illustrating techniques for swapping control circuitry for a disc drive assembly without having to recalibrate a disc drive assembly including the new control circuitry.

FIG. 4 is a block diagram illustrating techniques for swapping control circuitry for a disc drive assembly without having to recalibrate disc drive assembly including the new control circuitry. For clarity, the techniques shown in FIG. 4 are described with respect to disc drive assemblies 200 and 201 from FIGS. 2A and 2B respectively.

In the initial step, disc drive assembly 200 is calibrated (402). Disc drive assembly 200 includes PCB 204, which provides a first control circuitry, and housing 202, which encasing media disc 206. The first control circuitry comprises channel 232A and disc drive controller 236. In other embodiments, the first control circuitry may simply include a disc drive controller, but not a channel.

Calibration of disc drive assembly 200 creates calibration data. For example, the calibration data may include data track information for data tracks on media disc 206 and/or signal response calibration information for data signals recorded on the media disc 206. More specifically, signal response calibration information may include calibration information for a first signal path including head 215 and channel 232A. Head 215 is encased within housing 202 and reads data stored on media disc 206. As shown in FIG. 2A, this first signal path include analog signal path 241 and analog signal path 242A.

In the next step, the calibration data is recorded to memory within housing 202 (404). For example, the calibration data may be recorded to media disc 206.

After recording the calibration data to memory within housing 202, the first control circuitry is replaced with a second control circuitry in the disc drive assembly by replacing PCB 204 with PCB 254 (406).

In the last step, disc drive assembly 201 is operated with the control circuitry of PCB 254 using the calibration data (408). Operating disc drive assembly 201 with the control circuitry of PCB 254 includes reading data from media disc 206 using a second signal path. As shown in FIG. 2B, the second signal path include analog signal path 241 and analog signal path 242B. In this manner, the second signal path includes channel 232B and head 215.

Various embodiments of the invention have been described. However, various modifications may be made to the described embodiments within the spirit of the invention. For example, control circuitry in a disc drive as tested may be useful only for testing the disc drive, rather than providing standard functionality for a disc drive. Such "testing" control circuitry may be used repeatedly in the testing and calibration of multiple disc drives. As another example, control circuitry in a disc drive may be swapped with control circuitry having the same design, e.g., to repair a disc drive. These and other embodiments are within the scope of the following claims.

The invention claimed is:

1. A circuit board comprising:
a first ground plane;
a second ground plane;
a low pass filter, the first ground plane electrically coupled to the second ground plane by the low pass filter;
a storage device controller that reads and writes data, the storage device controller electrically coupled to the first ground plane; and
a digital video recorder (DVR) controller that controls storage, retrieval and display of selected video content, the DVR controller electrically coupled to the second ground plane.

2. The circuit board of claim 1, wherein the first ground plane and the second ground plane are within of a common layer of the circuit board.

3. The circuit board of claim 1, further comprising a video tuner that receives incoming video content and forwards it to the DVR controller.

4. The circuit board of claim 3, wherein the video tuner is electrically coupled to the second ground plane.

5. The circuit board of claim 3, wherein the incoming video content is an analog video signal, wherein the DVR controller converts the analog video signal to digital video data, wherein the DVR controller forwards the digital video data to the storage device controller, wherein the storage device controller records the digital video data to the media disc.

6. The circuit board of claim 1, further comprising a power control circuit that powers the storage device controller and DVR controller.

7. The circuit board of claim 1, wherein the storage device controller and the DVR controller are connected on the circuit board using a circuit board trace.

8. A system comprising:
a memory storing calibration data created during calibration of a storage device using a first circuit board, the first circuit board integrating electronic components of a digital video system onto the first circuit board, the first circuit board including:
a storage device controller that reads and writes data; and
a digital video recorder (DVR) controller that controls storage, retrieval and display of selected video content, the DVR controller connected to the storage device controller;
a second circuit board including different components relative to the first circuit board and with different functionality compared to the first circuit board, and configured to operate the storage device with the calibration data created by the first circuit board.

9. The system of claim 8, wherein a physical connection for an interface over which the DVR controller and the storage device control circuitry communicate includes a circuit board trace.

10. The system of claim 8, wherein the DVR controller includes an DVR controller video memory and flash memory.

11. The system of claim 8, further comprising a power control circuit that powers the storage device controller and DVR controller.

12. The system of claim 8, further comprising
a first ground plane electrically coupled to the storage device controller;
a second ground plane electrically coupled to the DVR controller; and
a low pass filter, the first ground plane electrically coupled to the second ground plane by the low pass filter.

13. The system of claim 12, wherein the first ground plane and the second ground plane are within of a common layer of the circuit board.

14. The system of claim 13, further comprising a video tuner that receives incoming video content and forwards it to the DVR controller.

15. The system of claim 14, wherein the video tuner is electrically coupled to the second ground plane.

16. The system of claim 15, wherein the incoming video content is an analog video signal, wherein the DVR controller converts the analog video signal to digital video data, wherein the DVR controller forwards the digital video data to the storage device controller, wherein the storage device controller records the digital video data to the media disc.

17. A method comprising:
creating calibration data using a first control circuitry of a first circuit board in a video system, the first circuit board integrating:
a storage device controller on the first circuit board that reads and writes data; and
a digital video recorder controller on the first circuit board that controls storage,
retrieval and display of selected video content, the digital video recorder
controller connected to the storage device controller;
replacing the first control circuitry with a second control circuitry of a second circuit board with different components relative to the first control circuitry in the video system, the second control circuitry configured to provide different functionality as compared to the first control circuitry; and
operating the video system with the second control circuitry using the calibration data.

18. The method of claim 17, further comprising communicating between the digital video recorder controller and the storage device controller via a circuit board trace.

19. The method of claim 17, further comprising electrically coupling a first ground plane to a second ground plane and filtering out high-frequency noise via a low pass filter.

20. The method of claim 17, wherein the video system includes a media disc in physical data storage, and wherein the second circuit board includes a video signal input, further comprising:
- receiving a video signal with video signal input; and
- recording video data from the video signal to the media disc.

* * * * *